(12) United States Patent
Ootsuka

(10) Patent No.: US 8,751,770 B2
(45) Date of Patent: Jun. 10, 2014

(54) SEMICONDUCTOR RECORDING APPARATUS AND SEMICONDUCTOR RECORDING SYSTEM

(75) Inventor: Takeshi Ootsuka, Hyogo (JP)

(73) Assignee: Panasonic Corporation, Osaka (JP)

( * ) Notice: Subject to any disclaimer, the term of this patent is extended or adjusted under 35 U.S.C. 154(b) by 789 days.

(21) Appl. No.: 12/812,238

(22) PCT Filed: Oct. 6, 2008

(86) PCT No.: PCT/JP2008/002811
§ 371 (c)(1),
(2), (4) Date: Jul. 9, 2010

(87) PCT Pub. No.: WO2009/090692
PCT Pub. Date: Jul. 23, 2009

(65) Prior Publication Data
US 2010/0293322 A1 Nov. 18, 2010

(30) Foreign Application Priority Data

Jan. 16, 2008 (JP) ................................. 2008-007088

(51) Int. Cl.
*G06F 12/00* (2006.01)
(52) U.S. Cl.
USPC ........... 711/203; 711/103; 711/170; 711/202; 710/10
(58) Field of Classification Search
None
See application file for complete search history.

(56) References Cited

U.S. PATENT DOCUMENTS

| | | | |
|---|---|---|---|
| 5,611,067 A | 3/1997 | Okamoto et al. | |
| 5,748,537 A * | 5/1998 | Garbers et al. | 365/185.33 |
| 5,890,188 A | 3/1999 | Okamoto et al. | |
| 5,933,847 A | 8/1999 | Ogawa | |
| 6,442,662 B1 | 8/2002 | Komatsu | |
| 6,477,632 B1 | 11/2002 | Kikuchi | |
| 2003/0163633 A1* | 8/2003 | Aasheim et al. | 711/103 |
| 2005/0182892 A1 | 8/2005 | Nakanishi et al. | |
| 2006/0112195 A1 | 5/2006 | Aoyama | |

FOREIGN PATENT DOCUMENTS

| | | |
|---|---|---|
| JP | H05-282889 | 10/1993 |
| JP | 06-302194 | 10/1994 |
| JP | H08-194640 | 7/1996 |
| JP | 9-097139 A | 4/1997 |

(Continued)

OTHER PUBLICATIONS

International Search Report for corresponding International Application No. PCT/JP2008/002811 mailed Dec. 9, 2008.

(Continued)

*Primary Examiner* — Matthew Bradley
*Assistant Examiner* — Alan Otto
(74) *Attorney, Agent, or Firm* — Renner, Otto, Boisselle & Sklar, LLP.

(57) ABSTRACT

A semiconductor recording apparatus includes a logical-to-physical conversion table 115 showing correspondence between a physical address of said semiconductor memory and a logical address and writes the table to a flash memory 120. On receiving a write command issued from a host device 200, a block management section 114 selects a physical block with reference to said logical-to-physical conversion table, and updates said logical-to-physical conversion table. A logical-to-physical conversion table initializing section 117 updates a physical address corresponding to each logical address of the logical-to-physical conversion table into an invalid address. Accordingly the apparatus can render the number of rewrites of physical blocks uniform irrespective of writing conditions.

7 Claims, 11 Drawing Sheets

(56) References Cited

FOREIGN PATENT DOCUMENTS

| | | |
|---|---|---|
| JP | 2004-280752 A | 10/2004 |
| JP | 2005-284659 | 10/2005 |
| JP | 2006-127247 | 5/2006 |
| JP | 2006-146585 A | 6/2006 |
| WO | WO 99/30239 | 6/1999 |

OTHER PUBLICATIONS

Form PCT/ISA/237.
Japanese Official Action mailed Sep. 10, 2013 for corresponding Japanese Patent Application No. 2009-549898.

* cited by examiner

F I G. 6

| Logical block number | 0 | 1 | ............ | L | L+1 | ............ | B−m |
|---|---|---|---|---|---|---|---|
| Physical block number | 3 | 6 | | A | A | | B−2 |

115

F I G. 7

| Physical block number | 0 | 1 | 2 | 3 | .................. | B−1 |
|---|---|---|---|---|---|---|
| Usage state | 1 | 0 | 0 | 1 | | 0 |

| Logical block number | 0 | 1 | ......... | L | L+1 | ......... | B−m |
|---|---|---|---|---|---|---|---|
| Physical block number | 3 | 6 | | A | A | | B−2 |

FIG. 8B

| Logical block number | 0 | 1 | ......... | L | L+1 | ......... | B−m |
|---|---|---|---|---|---|---|---|
| Physical block number | 3 | 6 | | B−1 | A | | B−2 |

FIG. 8C

| Logical block number | 0 | 1 | ......... | L | L+1 | ......... | B−m |
|---|---|---|---|---|---|---|---|
| Physical block number | 3 | 6 | | B−1 | 1 | | B−2 |

| Logical block number | 0 | 1 | ............ | L | L+1 | ............ | B-m |
|---|---|---|---|---|---|---|---|
| Physical block number | 0 | A | A | A | A | A | A |

115

PBN (A-2)

SEMICONDUCTOR RECORDING APPARATUS AND SEMICONDUCTOR RECORDING SYSTEM

TECHNICAL FIELD

The present invention relates to a semiconductor recording apparatus such as a memory card and a semiconductor recording system, and more particularly to technologies for rendering physical blocks of a semiconductor memory uniform in terms of the number of times for rewrite process.

BACKGROUND ART

Heretofore semiconductor recording equipment such as a SD (Secure Digital) card that is a card-type recording medium having a built-in flash memory has a ultra-compact and ultra-thin form and has been widely used to record data including images in digital cameras, portables, and so forth because of its handleability.

A flash memory incorporated in semiconductor recording equipment is a memory capable of data erasing and rewriting by blocks of a predetermined size, and there is a limitation on the number of rewrites. A multi-level flash memory is designed to allow approximately 10,000 rewrites for each physical block. When the number of rewrites exceeds 10,000, the probability of writing error occurrence is increased. Note that a method that is adopted in the event of a writing error involves a step of registering a block which encounters a writing error as an error block and a step of performing writing to a block other than the error block.

Therefore, in the case of recording a moving image on the flash memory in real time, if writing errors occur with high frequency, the rate of writing to the flash memory will be lower than the rate of produced image transfer to the flash memory. This leads to the problem of inability to perform sequential recording of moving images.

As a technology conducive to retard occurrence of this problem, there is known a conventional art for causing pseudo increase in the number of rewrites in a memory (refer to Patent Document 1).

According to this conventional art, a memory is divided into a plurality of areas, and the number of rewrites for each area is stored. On the basis of the number of rewrites for each area in storage, rewrite process in the memory is so controlled that the difference in rewrite number among the individual areas can be reduced; that is, an area subjected to fewer rewrites is prioritized for use. Such a technique for exercising rewrite control in a manner to reduce the difference in rewrite number among the areas is called "leveling". With use of this technique, even in the case of writing data to one and the same logical block several times, physical blocks that are actually subjected to recording in a flash memory change. If the leveling is accomplished perfectly, the allowable number of rewrites in semiconductor recording equipment will be increased to a level given as: (the number of physical blocks)× (the allowable number of rewrites for each physical block).

In Patent Document 2, there is proposed a semiconductor recording apparatus composed of: a rewrite number counting section for keeping count of the number of rewrites, or the number of blocks responsible for data writing to a flash memory at the request of host device; a rewrite number reading section for reading out the total number of rewrites written to the flash memory; and a rewrite number recording section that, on the basis of the number of rewrites counted by the rewrite number counting section and the total number of rewrites read out by the rewrite number reading section, derives a new total number of rewrites, or the sum of rewrites counted since the first run, and writes the thereby obtained total number of rewrites into the flash memory. In this construction, the rewrite number recording section writes the obtained total number of rewrites into the flash memory at the instant when the number of rewrites counted since the last writing of the total number of rewrites reaches a predetermined number of times or above.

In a camera recorder or the like, image data is recorded on the whole region of a memory card. After the recorded image data is uploaded to HDD or the like, the memory card is formatted for a further recording process. In such an intended purpose, the value of (the total number of rewrites/the number of physical blocks) substantially coincides with the upper limit of the number of rewrites set for a semiconductor memory. Therefore, by effecting light emission such as a warning light as the number of rewrites approaches the upper limit, it is possible for the user to be aware of the limitations on usage of the memory.

[Patent Document 1] Japanese Unexamined Patent Publication JP-A Hei 6-302194
[Patent Document 2] Japanese Unexamined Patent Publication JP-A 2005-284659

DISCLOSURE OF THE INVENTION

Problems to be Solved by the Invention

The case where the operation of a memory card such as a SD card proceeds in accordance with the following sequence will be described with reference to FIGS. 1 and 2. Note that FAT is used as a file system.
Sequence 0 Initial state
Sequence 1 Memory card is logically formatted
Sequence 2 Memory card is recorded upon up to full capacity
Sequence 3 Contents recorded on the memory card are uploaded to a server
Sequence 4 Memory card is logically formatted once again
Sequence 5 Memory card is recorded upon up to half the capacity
Sequence 6 Contents recorded on the memory card are uploaded to the server
Sequence 7 Memory card is logically formatted once again
Sequence 8 Memory card is recorded upon up to half the capacity
Sequence 9 Contents recorded on the memory card are uploaded to the server
From then on, Sequences 7 to 9 will be repeated.
Physical blocks of a semiconductor memory constituting the memory card are classified into:
E Erased block;
W Written and unerasable block; and
I Written but erasable block.
In order to cope with subsequent development of bad blocks and to effect leveling, the number of physical blocks is set to be larger than that of logical blocks by a predetermined number of blocks.

In Sequence 0, the memory card is placed in the initial state, wherefore physical blocks except for those that are used in the internal system of the memory card are all erased blocks E as shown in the portion (a) of FIG. 1.

In Sequence 1, logical formatting of the memory card corresponds to recording of a new file allocation table (hereafter referred to simply as "FAT"). Accordingly, as shown in the portion (b) of FIG. 1, the physical block used for FAT recording becomes a written block W.

In Sequence 2, write commands are sequentially issued in numerical order according to logical block number by a host. Out of the physical blocks of the semiconductor memory, erased physical blocks are sequentially assigned to the issued logical blocks in ascending order of block number. Accordingly, following the completion of Sequence 2, as the result of full-capacity recording, the physical blocks corresponding to the capacity of all of logical blocks become written blocks W as shown in the portion (c) of FIG. 1.

In Sequence 3, the recorded data is uploaded. Then, in re-formatting process in Sequence 4, a new FAT is written. At this time, the FAT is recorded on the erased block E shown in the portion (c) of FIG. 1, and the said block becomes a written block W1. The newly recorded area will be termed "W1" to make a distinction from the previously recorded area. The FAT recorded previously is no longer necessary and thus the relevant block becomes an erasable block I. Such a state is shown in the portion (d) of FIG. 1.

In Sequence 5, the memory is recorded upon up to half its capacity in order, from an erased block E next to the block bearing the newly written FAT. Old data corresponding to each logical block recorded is no longer necessary, wherefore the relevant blocks sequentially become an erasable block I at each recording process. Since the data of a next logical block is written to this erasable block, it follows that sequential shifts in the position of the erasable block I occur in order, from a physical block next to the block bearing the newly written FAT. In the portion (a) of FIG. 2, there is shown a state of the physical blocks of the memory card that has undergone half-capacity recording in Sequence 5. A physical block W corresponding to a logical block independent of issuance of a write command is left unupdated.

Moreover, in Sequence 6, internal contents are uploaded to a server. Subsequently, logical formatting is carried out once again in Sequence 7. An area newly recorded at this time will be termed "W2" to make a distinction from the previously recorded area. In the memory under a condition as shown in the portion (a) of FIG. 2, a new FAT is recorded on an erasable block I in Sequence 7, whereupon the block becomes a written block W2. The physical block bearing the original FAT is no longer necessary and thus becomes an erasable block I. In the portion (b) of FIG. 2, there is shown a state of the physical blocks of the memory card as seen after Sequence 7 is completed.

In Sequence 8, the memory is recorded upon up to half its capacity in order, from an erased block I shown in the portion (b) of FIG. 2, so as to be brought into a condition as shown in the portion (c) of FIG. 2. The physical blocks bearing old data corresponding to the same logical block recorded become an erased block I, because the old data is no longer necessary. As shown in the portion (c) of FIG. 2, due to half-capacity recording, a physical block W corresponding to a logical block independent of issuance of a write command is left unupdated.

Thus, following the completion of full-capacity recording, a task involving logical formatting (initialization of FAT part) and half-capacity recording is repeated. In this case, at the time of issuance of logical addresses by a file system, only the first half of all the logical addresses is produced, with the consequence that physical blocks corresponding to the remaining half of the logical addresses are left unupdated.

For example, assuming that, following the completion of full-capacity recording, a task involving logical formatting of the semiconductor memory and half-capacity recording has been repeated 10000 times, then one-time-rewritten physical blocks and 10000-times-rewritten physical blocks coexist. In the case of determining the number of rewrites in the conventional memory card disclosed in Patent Document 2, the result will be 5000 times, with consequent occurrence of a significant error between the result and an actual number of rewrites.

Furthermore, although the aforestated problem can be overcome by executing physical formatting to erase all logical blocks instead of logical formatting to initialize FAT part, the physical formatting poses the problem of requiring much time to erase all blocks.

The present invention has been devised to solve the aforestated problems, and accordingly its object is to provide a semiconductor recording apparatus and a semiconductor recording system capable of rendering physical blocks uniform in terms of the number of rewrites irrespective of writing conditions of a memory and allowing high-rate formatting.

Means to Solve the Problems

To solve the problems, a semiconductor recording apparatus of the present invention includes a semiconductor memory composed of a plurality of physical blocks, for recording data written by a host device on said semiconductor memory and reading recorded data, and comprises: a block management section which records a logical-to-physical conversion table showing correspondence between a physical address of said semiconductor memory and a logical address included in a command issued from said host device on said semiconductor memory, selects a physical block corresponding to a logical block in the command issued from said host device with reference to said logical-to-physical conversion table, and updates said logical-to-physical conversion table upon data writing for implementation of address management; a logical formatting detecting section for detecting accomplishment of logical formatting for the semiconductor memory; and a logical-to-physical conversion table initializing section for updating a physical address corresponding to each logical address of the logical-to-physical conversion table into an invalid address immediately after a detection of logical formatting by said logical formatting detecting section.

In the semiconductor recording apparatus, said block management section may record said logical-to-physical conversion table sequentially on pages of a predetermined physical block of said semiconductor memory in numerical order according to page number for implementation of updating, and said logical-to-physical conversion table initializing section may update physical addresses corresponding to at least part of logical addresses into invalid addresses immediately after the detection of completion of logical formatting by said logical formatting detecting section, and record the updated logical-to-physical conversion table sequentially on the pages of the physical block.

In the semiconductor recording apparatus, said logical-to-physical conversion table may be divided into K pieces of area portions (K represents a natural number of greater than or equal to 2), and, when logical formatting is executed, said logical-to-physical conversion table initializing section select and initializes at least one of said K pieces of logical-to-physical conversion table area portions.

To solve the problems, a semiconductor recording apparatus of the present invention includes a semiconductor memory composed of a plurality of physical blocks, for recording data written by host device on said semiconductor memory and reading recorded data, and comprises: a block management section which records a logical-to-physical conversion table showing correspondence between a physical address of said semiconductor memory and a logical address included in a command issued from said host device on said semiconductor memory, selects a physical block corresponding to a logical block in the command issued from said host device with reference to the logical-to-physical conversion table, and updates the logical-to-physical conversion table upon data writing for implementation of address management; and a logical-to-physical conversion table initializing section for updating physical addresses corresponding to at least part of logical addresses of said logical-to-physical conversion table into invalid addresses when a logical-to-physical conversion table initialization command is issued from said host device.

In the semiconductor recording apparatus, said block management section may record said logical-to-physical conversion table sequentially on pages of a predetermined physical block of said semiconductor memory in numerical order according to page number for implementation of updating, and said logical-to-physical conversion table initializing section may update physical addresses corresponding to at least part of logical addresses into invalid addresses at a time of initialization of said logical-to-physical conversion table, and record said updated logical-to-physical conversion table sequentially on a page of said physical block.

In the semiconductor recording apparatus, said logical-to-physical conversion table may be divided into K pieces of area portions (K represents a natural number of greater than or equal to 2), and, when logical formatting is executed, said logical-to-physical conversion table initializing section select and initializes at least one of the K pieces of logical-to-physical conversion table area portions.

To solve the problems, a semiconductor recording system of the present invention comprises: a host device; and a semiconductor recording apparatus connected to said host device, said semiconductor recording apparatus includes: a semiconductor memory composed of a plurality of physical blocks; a block management section which records a logical-to-physical conversion table showing correspondence between a physical address of said semiconductor memory and a logical address included in a command issued from said host device on said semiconductor memory, selects a physical block corresponding to a logical block in the command issued from said host device with reference to said logical-to-physical conversion table, and updates said logical-to-physical conversion table upon data writing for implementation of address management; and a logical-to-physical conversion table initializing section for updating physical addresses corresponding to at least part of logical addresses of said logical-to-physical conversion table into invalid addresses when a logical-to-physical conversion table initialization command is issued from said host device, and wherein said semiconductor recording apparatus records data written by said host device and reads recorded data, and wherein the host device transfers a command to said semiconductor recording apparatus and, when initializing its file system, issues a logical-to-physical conversion table initialization command in addition to a file system initialization command.

Advantages of the Invention

According to the semiconductor recording apparatus of the present invention, a correlation between a logical address and a physical address can be brought out into the open at the time of logical formatting. Therefore, for example, even if a task involving logical formatting and recording up to a certain extent within capacity is repeated after full-capacity recording, it never occurs that rewrite process is concentrated on part of physical blocks. This makes it possible to render physical blocks of a semiconductor memory uniform in terms of the number of rewrites.

Moreover, rewrite-number errors that arise in the case of determining the number of rewrites in the conventional semiconductor apparatus disclosed in Patent Document 2 can be significantly reduced.

Further, according to the present invention, in performing logical formatting, the same effects as achieved in physical formatting to erase all blocks can be achieved, yet the time required for the operation is shorter than that in physical formatting.

BRIEF DESCRIPTION OF DRAWINGS

FIG. 6 is an explanatory view of a logical-to-physical conversion table of the embodiment.

FIG. 7 is an explanatory view of an invalid block management table 116 of the embodiment.

FIG. 8A is a state transition diagram of the logical-to-physical conversion table of the embodiment.

FIG. 8B is a state transition diagram of the logical-to-physical conversion table of the embodiment.

FIG. 8C is a state transition diagram of the logical-to-physical conversion table of the embodiment.

EXPLANATION OF REFERENCE DESIGNATIONS

Figure 1:
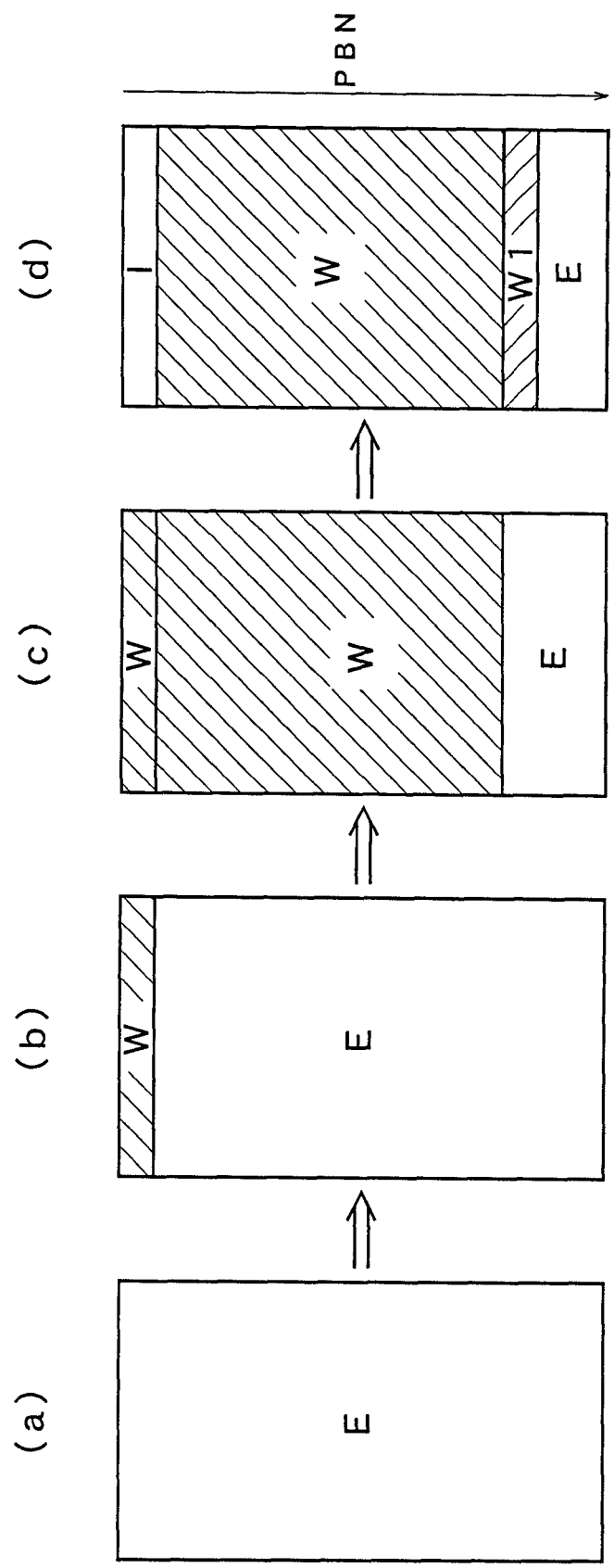
FIG. 1 is a view of the conventional semiconductor recording apparatus, showing a condition of a flash memory where those that range from the first to the halves of all logical blocks are recorded upon.
Figure 2:
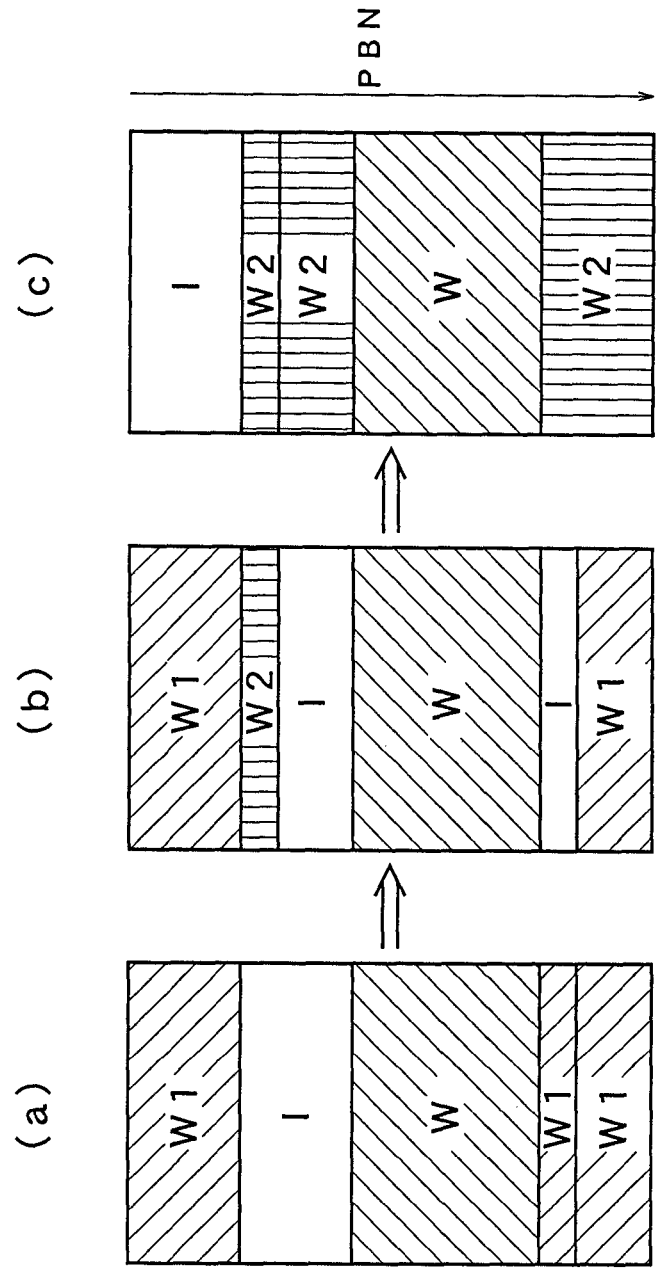
FIG. 2 is a view of the conventional semiconductor recording apparatus, showing another condition of the flash memory where those that range from the first to the halves of all logical blocks are recorded upon.

100 Semiconductor recording apparatus
110 Memory controller
111 External interface 112 Command analyzing section
113 Logical formatting detecting portion
114 Block management section
115 Logical-to-physical conversion table
116 Invalid block management table
117 Logical-to-physical conversion table initializing section
120 Flash memory
200 Host device

BEST MODE FOR CARRYING OUT THE INVENTION

Figure 3:
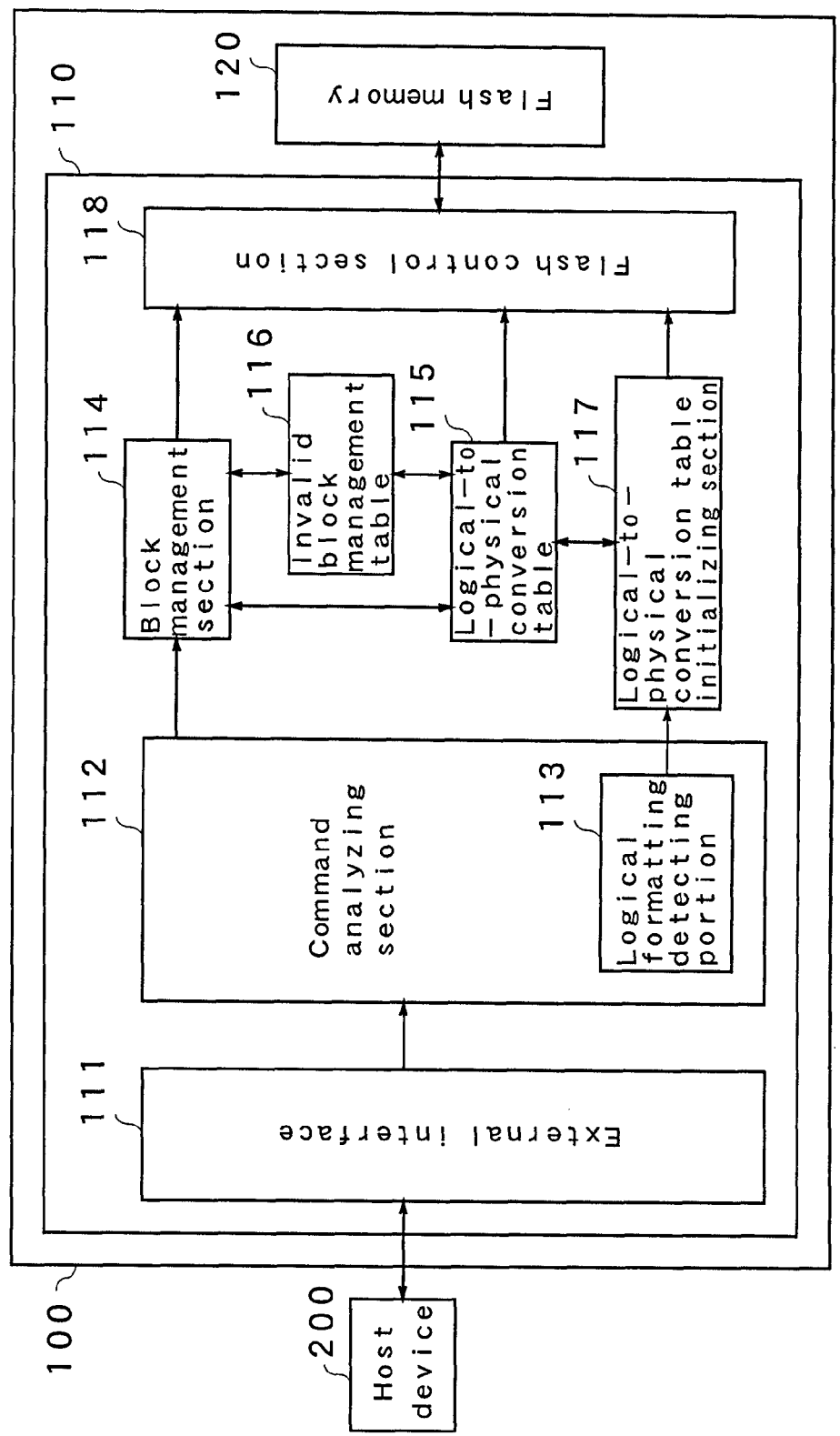
FIG. 3 is a configuration diagram of a semiconductor recording apparatus in accordance with an embodiment of the present invention.

In FIG. 3, there is shown a configuration diagram of a semiconductor recording system in accordance with an embodiment of the present invention. In FIG. 3, for example, a semiconductor recording apparatus 100 is built as a memory card, and is connected to a host device 200 to stand ready for use. The semiconductor recording apparatus 100 is composed of a memory controller 110 for exercising data writing-reading control over a flash memory and a flash memory 120 which is a nonvolatile memory.

The memory controller 110 includes an external interface 111, a command analyzing section 112, a block management section 114, a logical-to-physical conversion table 115, an invalid block management table 116, a logical-to-physical conversion table initializing section 117, and a flash control section 118.

Next, the memory controller 110 will be described in detail. The external interface 111 is an interface which receives a command from the host device 200 and effects data transfer.

The command analyzing section 112 analyzes commands including a read command and a write command received by the external interface 111. Within the command analyzing section 112 is disposed a logical formatting detecting portion 113 for detecting logical formatting in the presence of commands. The logical formatting detecting portion 113 detects the accomplishment of logical formatting upon the writing of FAT data to a predetermined logical block.

The logical-to-physical conversion table 115 is a logical-to-physical conversion table showing correspondence between a logical block number issued from the host device 200 and a physical block number recorded on the flash memory 120. This table is recorded on a volatile memory of the memory controller 110 and is simultaneously recorded on 1 page of one of the physical blocks of the flash memory 120.

The invalid block management table 116 is a table constructed of a volatile memory bearing information representing whether a physical block of the flash memory 120 is a used block or an invalid block. As will hereafter be described, the table 116 is produced on the basis of the logical-to-physical conversion table 115 at the time of power supply.

Next, the block management section 114 manages the logical-to-physical conversion table 115 and the invalid block management table 116. When a write command is issued from the host device 200 and a new physical block is assigned to a logical block, the block management section 114 updates the logical-to-physical conversion table 115 and also updates record of a logical-to-physical conversion table within the flash memory 120.

The logical-to-physical conversion table initializing section 117 effects initialization of the logical-to-physical conversion table 115 when the logical formatting detecting portion 113 detects logical formatting. As will hereafter be described, the initialization is effected by setting the address of a physical block corresponding to a logical block to an invalid block.

The flash control section 118 is a block for writing data to the flash memory 120 in accompaniment with command analysis and reading data out of the flash memory 120.

Figure 4:
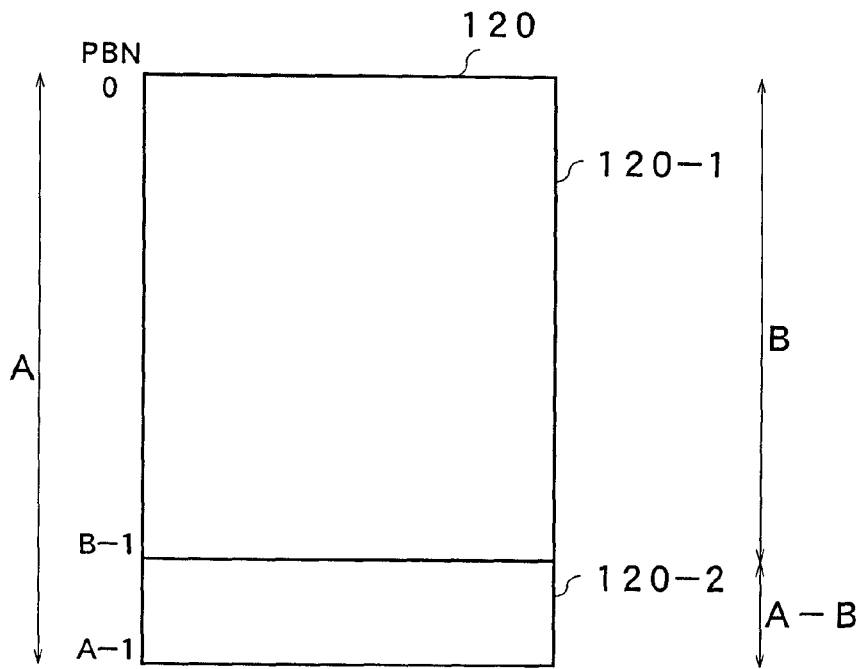
FIG. 4 is an explanatory view of a memory area of a flash memory of the embodiment.

Next, the flash memory 120 will be explained. As shown in FIG. 4, the flash memory 120 consists of A pieces of physical blocks (A represents a natural number). A physical block is the unit of erasing. In this embodiment, physical block numbers PBN ranging from 0 to (A-1) are given to A pieces of physical blocks, respectively. B pieces of physical blocks having physical block numbers 0 to B-1 (B represents a natural number which fulfills the condition of B<A) are defined as a first area 120-1 of the memory, whereas (A-B) pieces of physical blocks having physical block numbers B to (A-1) are defined as a second area 120-2 of the memory. User data transferred from the host device 200 is recorded on the first area 120-1 of the flash memory 120, and system data including the logical-to-physical conversion table 115 is recorded on the second area 120-2. A file system such as FAT is written to the first area 120-1 along with user data.

The flash memory is characterized in that a recorded page cannot be overwritten and there is a limitation on the number of rewrites. Logical block numbers provided from the host device 200 range from 0 to (B-m) (m represents a natural number of greater than or equal to 1). That is, compared to the number of logical blocks, the number of physical blocks of the first area 120-1 of the memory corresponding to the logical blocks is set to be larger in allocation. Thereby, in the case of rewriting a recorded logical block, recording can be performed on a physical block other than the one recorded in correspondence with the said logical block. Hence, even if issuance of write commands from the host device is concentrated on one and the same logical block, by establishing correspondences between a logical block number and a physical block number in the logical-to-physical conversion table, it is possible to prevent concentration of rewrites on one and the same physical block.

Figure 5:
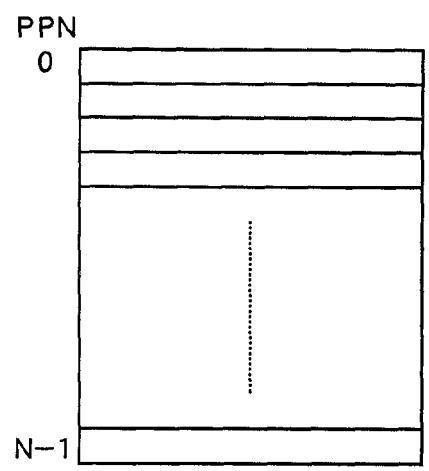
FIG. 5 is a configuration diagram of a physical block constituting the flash memory of the embodiment.

Moreover, as shown in FIG. 5, each physical block consists of N pieces of pages (N represents a natural number), and the pages are given page numbers PPN ranging from 0 to (N-1), respectively. A page is the unit of data recording, and data can be recorded on a physical block on a page-by-page basis. For example, when the size of data of the logical-to-physical conversion table 115 is equivalent to 1 page, then the logical-to-physical conversion table can be recorded N times on one and the same physical block.

FIG. 6 is a diagram of an example of the logical-to-physical conversion table 115, illustrating the state where a logical block with a logical block number 0 is mapped to a physical block with a physical block number 3 and a logical block with a logical block number 1 is mapped to a physical block with a physical block number 6. Moreover, a number A indicative of invalidity is recorded for each of a logical block with a logical block number L and a logical block with a logical block number (L+1). This means that these logical blocks bear no data.

FIG. 7 is a view of an example of the invalid block management table 116, illustrating the usage state of each physical block. A physical block whose usage state is represented by a numeral 1 is now in use; that is, bears significant data. On the other hand, a physical block whose usage state is represented by a numeral 0 is an invalid block, and two cases will be considered as to this physical block, i.e. a case where it bears invalid data and a case where it is an erased block. In either case, the block is available for new recording process.

Hereinafter the workings of the block management section 114 will be described in detail. The block management section 114 exercises block management over the semiconductor recording apparatus as a whole while updating the logical-to-physical conversion table 115 and the invalid block management table 116. The block management section 114 controls the invalid block management table 116 as follows.

(Step 1) All of the blocks of the table 116 are initialized into an invalid state upon the supply of power.

(Step 2) A defective block is updated to a used block on the table 116. Although no detailed description about defective block management will be given to avoid digressions from the very nature of the present invention, it is recorded at a fixed position of the flash memory.

(Step 3) The logical-to-physical conversion table 115 is read out to update a physical block in use to a used block on the table 116.

(Step 4) When rewriting a recorded logical block, an invalid block is selected from the table 116 and data is recorded on the selected invalid block. Then, the selected block is updated to a used block, and the immediately preceding physical block corresponding to the said logical block is updated to an invalid block.

As described above, the block management section 114 produces the invalid block management table 116 at the time of power supply. In order to perform recording on a new physical block, erasable blocks are sequentially allocated as new blocks from the table 116 in order, from the pointer of the most recently recorded block, and the table 116 is then updated.

FIG. 8A shows the logical-to-physical conversion table 115 as seen at a certain point in time. FIG. 8B shows the table 115 which has undergone the transition from the state of FIG. 8A to the state where data was recorded on a logical block No. L. FIG. 8C shows the table 115 which has undergone the transition from the state of FIG. 8B to the state where data was recorded on a logical block No. (L+1).

Figure 9A:
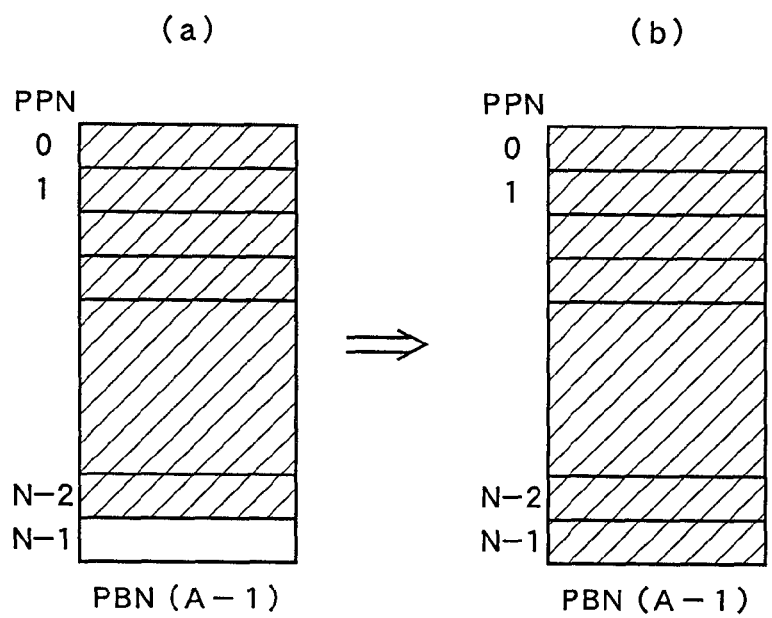
FIG. 9A is a state transition diagram of a physical block storing the logical-to-physical conversion table of the embodiment.
Figure 9B:
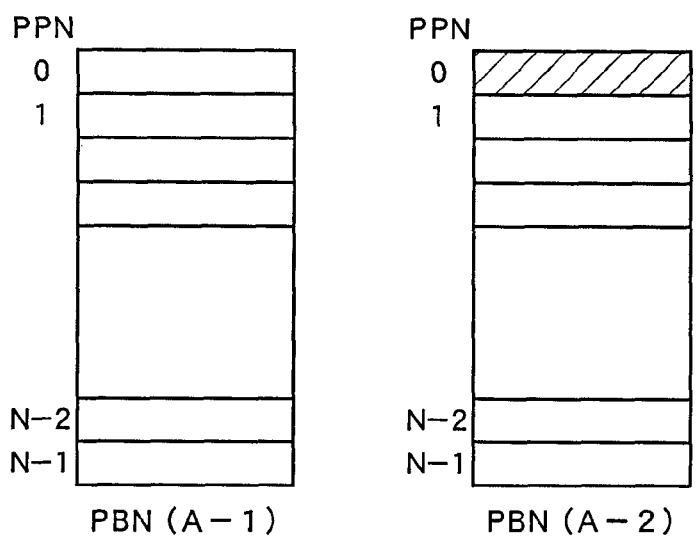
FIG. 9B is a state transition diagram of a physical block storing the logical-to-physical conversion table of the embodiment.

Next, a physical block for storing the logical-to-physical conversion table 115 will be explained. FIGS. 9A and 9B are views each showing a state transition of the physical block for storing the logical-to-physical conversion table 115. The page represented by hatching is a recorded page.

In this embodiment, the logical-to-physical conversion tables are sequentially recorded on a per-page basis in order, from the first page of the last block in the second area 120-2 of the flash memory, namely the physical block with a physical block number of (A-1). In the portion (a) of FIG. 9A, there is shown the state where (N-1) pieces of logical-to-physical conversion tables have been recorded on the pages ranging from 0 to (N-2), respectively, in the physical block with a physical block number of (A-1), and the latest logical-to-physical conversion table is stored in the page No. (N-2). Moreover, the page No. (N-1) is a yet-to-be-recorded page. Note that the logical-to-physical conversion table 115 shown in FIG. 8A is illustrated as being recorded on the page No. (N-2).

The operation in the case where the host device 200 issues a write command with respect to the logical block No. L under the condition described just above will be described with reference to FIGS. 8A to 10A and 10B. In FIG. 8A, there is shown the current logical-to-physical conversion table in which the logical block No. L bears [A] indicative of invalidity and is thus not assigned with any physical block. Hence, the block management section 114 runs a search for an invalid block with reference to the invalid block management table 116. In FIG. 7, there is shown the current invalid block management table 116 in the state where the physical block with a physical number of (B-1) is a search target. The block management section 114 assigns the physical block with a physical number of (B-1) to the logical block with a logical block number of L, and updates the logical-to-physical conversion table 115 so that it changes to a state as shown in FIG. 8B. The flash control section 118 records the updated logical-to-physical conversion table 115 on the page No. (N-1) of the physical block with a physical block number of (A-1). Upon this recording the transition to the state shown in the portion (b) of FIG. 9A takes place.

Moreover, the case where the host device 200 issues a write command with respect to the logical block No. (L+1) will be described. In the current logical-to-physical conversion table 115 shown in FIG. 8B, the logical block No. (L+1) bears A indicative of invalidity and is thus not assigned with any physical block. Hence, the block management section 114 runs a search for an invalid block. When a physical block number 1 is found as the result of the invalid block search, then the physical block with the physical block number 1 is assigned to the logical block with a logical block number of (L+1), and the logical-to-physical conversion table 115 is updated so that it changes to a state as shown in FIG. 8C. The flash control section 118 writes the updated logical-to-physical conversion table to the flash memory 120. As shown in the portion (b) of FIG. 9A, all of the pages of the physical block with a physical block number of (A-1) assigned to the logical-to-physical conversion table are now in a recorded state. In this case, the block management section 114 extracts the physical block having a number of (the current physical block number-1) as a new physical block in the second area of the flash memory 120. As shown in FIG. 9B, in this case, the latest logical-to-physical conversion table shown in FIG. 8C is recorded on the page 0 of the physical block with a physical block number of (A-2). By doing so, since at least the latest logical-to-physical conversion table and the logical-to-physical conversion table which has been effective until immediately before the latest one are held in the flash memory 120, it is possible to make a return to the immediately preceding state as required.

Next, logical formatting and subsequent initialization of the logical-to-physical conversion table will be explained. Logical formatting of the FAT system is carried out by recording a new FAT table from the host device 200 on the semiconductor recording apparatus 100. The on-logical-address recording position of the FAT table is determined in advance so as to correspond to, for example, a logical block number 0.

In the host device, when the position of the FAT table is assigned to the logical block No. 0, then the logical formatting detecting portion 113 placed in the command analyzing section 112 detects that predetermined data indicating the presence of the FAT table is recorded on the logical block No. 0. Upon detection of the accomplishment of logical formatting, the logical formatting detecting portion 113 acts to provide a detection signal to the logical-to-physical conversion table initializing section 117.

Next, the workings of the logical-to-physical conversion table initializing section 117 will be explained. The initialization of the logical-to-physical conversion table 115 is effected by setting physical blocks corresponding to all of logical blocks except for the logical block No. 0 bearing the FAT table to be invalid blocks A. Let it be assumed that the table 115 shown in FIG. 8C is initialized under a write condition as shown in FIG. 9B. The logical-to-physical conversion table 115 under this condition is shown in FIG. 10A, and the state of the physical block with a physical block number of (A-2) on which is recorded this logical-to-physical conversion table is shown in FIG. 10B.

Figures 10A, 10B:
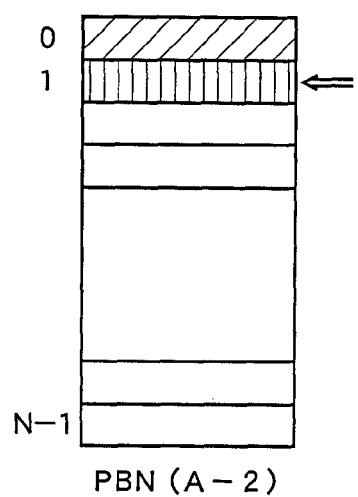
FIG. 10A is an explanatory view of the logical-to-physical conversion table of the embodiment as seen after initialization.
FIG. 10B is an explanatory view of the storage physical block of the embodiment as seen after initialization.

As shown in FIG. 10A, in the logical-to-physical conversion table 115 in an initialized state, physical blocks corresponding to all of logical blocks except for the logical block No. 0 bearing the FAT table all have a physical block number of A (invalid block). In this way, by setting physical blocks corresponding to all of logical blocks except for the one holding the FAT table in the first area of the flash memory to be invalid blocks, it is possible to render usable almost all of the physical blocks, except for a defective block, of the first area of the flash memory 120 under the management of the invalid block management table 116. The thereby initialized logical-to-physical conversion table is recorded at a position as indicated by an arrow in FIG. 10B, or the next page of the physical block which has stored therein the logical-to-physical conversion table until just before.

Next, a description will be given below as to the operation in the case where the logical-to-physical conversion table is initialized immediately after logical formatting and, after performing recording on all of logical blocks, logical formatting and sequential recording on logical blocks ranging from the first to the one having a logical block number of half the maximum logical block number will be repeated. As is the case described earlier in the paragraph "Problems to be solved by the Invention", this operation proceeds in the following sequence.

Sequence 0 Initial state
Sequence 1 Memory card is logically formatted
Sequence 2 Logical-to-physical conversion table is initialized
Sequence 3 Memory card is recorded upon up to full capacity
Sequence 4 Contents recorded on the memory card is uploaded to a server
Sequence 5 Memory card is logically formatted once again
Sequence 6 Logical-to-physical conversion table is initialized
Sequence 7 Memory card is recorded upon up to half the capacity
Sequence 8 Contents recorded on the memory card is uploaded to the server
Sequence 9 Memory card is logically formatted once again
Sequence 10 Logical-to-physical conversion table is initialized
Sequence 11 Memory card is recorded upon up to half the capacity
Sequence 12 Contents recorded on the memory card is uploaded to the server From then on, Sequences 9 to 12 will be repeated.

Next, the conditions of physical blocks of the semiconductor memory during execution of each sequence will be described. Also herein physical block conditions are classified into:
E Erased block
W Written and unerasable block
I Written but erasable block In the portion (a) of FIG. 11, there is shown the state of the flash memory 120 of the memory card in Sequence 0. In Sequence 1, as shown in the portion (b) of FIG. 11, a FAT table is written to the first physical block, whereupon the block becomes a written block W. Following the completion of logical formatting, in Sequence 2, the logical-to-physical conversion table is initialized. There is no change at this time, because every blocks has been erased in the original state. After that, when the memory card is recorded upon up to its full capacity in Sequence 3, as shown in the portion (c) of FIG. 11, physical blocks in the first area corresponding to all of the transferred logical blocks become written blocks W.

Figure 11:
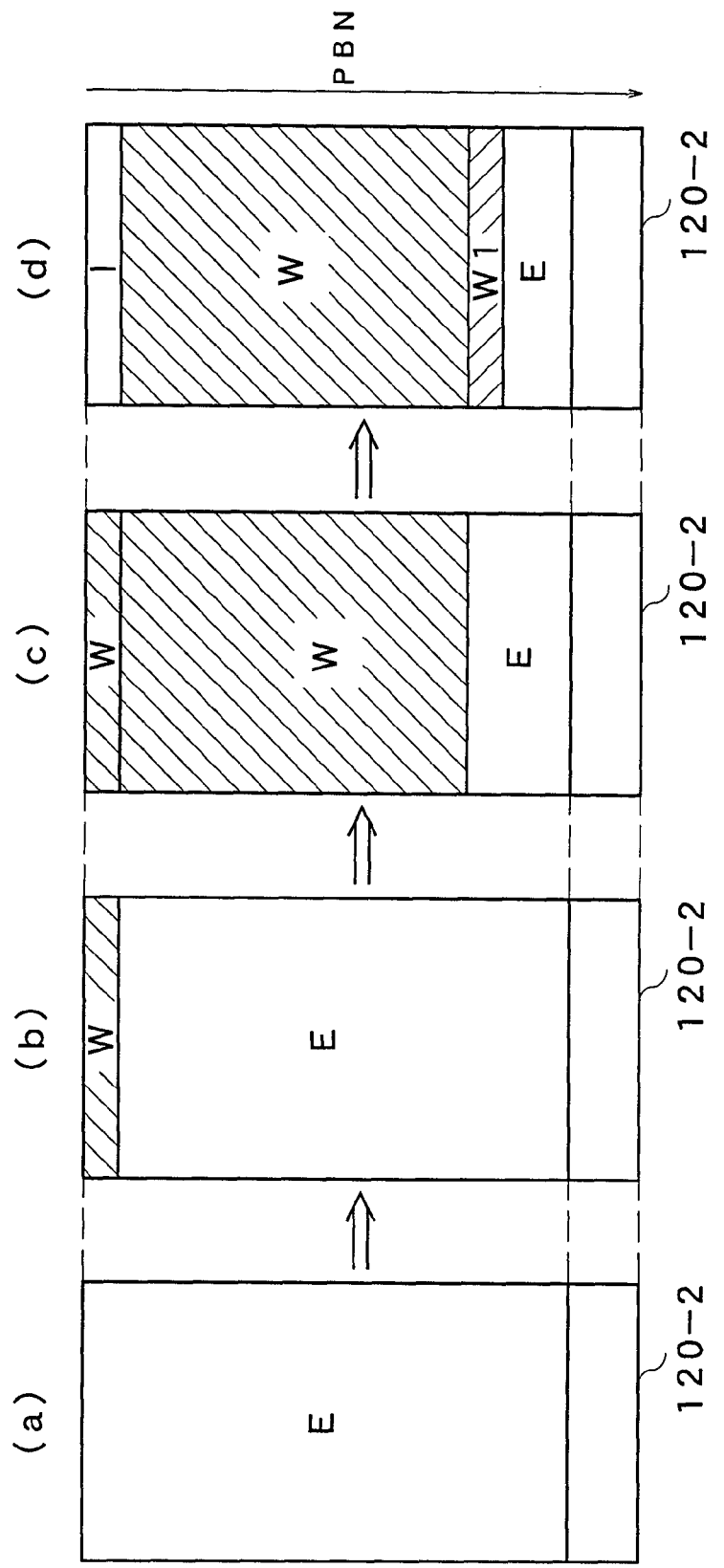
FIG. 11 is a state transition diagram of the flash memory of the semiconductor recording apparatus of the embodiment in the case where all logical blocks are recorded upon.

In Sequence 4, the recorded data is uploaded to the server. Next, in Sequence 5, the host device 200 transfers a new FAT for re-formatting. The semiconductor recording apparatus 100 records the FAT on the erased block E shown in the portion (c) of FIG. 11. This recorded physical block will be termed "W1" to make a distinction from the previously recorded area. Since the previously recorded FAT is no longer necessary, the physical block bearing the FAT becomes an erasable block I. In the portion (d) of FIG. 11, there is shown the state as seen after Sequence 5. The physical block conditions shown in the portions (a) to (d) of FIG. 11 are the same as those in the conventional case, the only difference being the addition of the second area 120-2.

In Sequence 6, the logical formatting detecting portion 113 of the command analyzing section 112 detects that FAT has been recorded once again with respect to the logical block 0, and provides output of a detection signal to the logical-to-physical conversion table initializing section 117. In response to this, the logical-to-physical conversion table initializing section 117 initializes the logical-to-physical conversion table 115. The initialized logical-to-physical conversion table is written to the flash memory 120 via the flash control section 118. By this logical-to-physical conversion table initialization, as shown in the portion (a) of FIG. 12, the area of the physical block W becomes an erasable physical block I.

Figure 12:
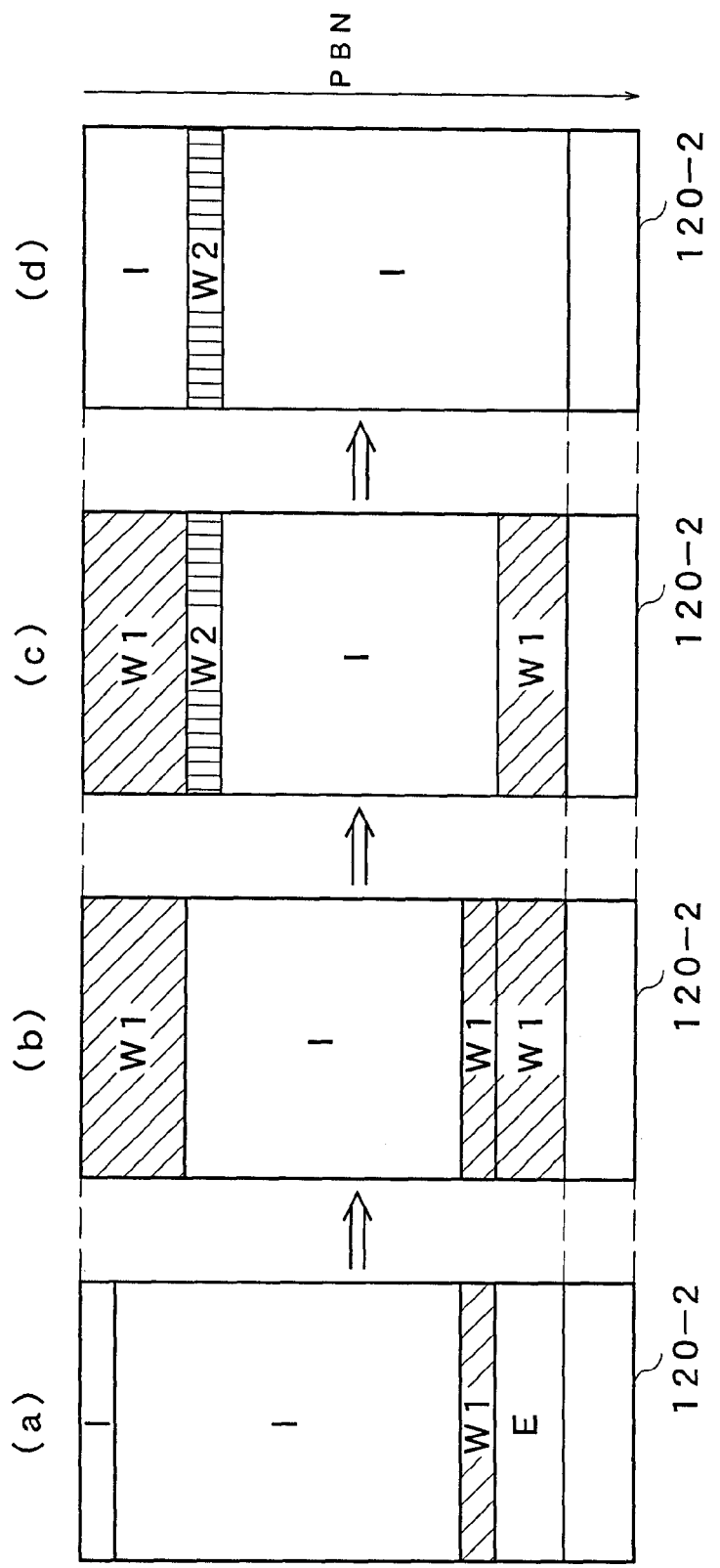
FIG. 12 is a view of the embodiment, showing a condition of the flash memory where those that range from the first to the halves of all logical blocks are recorded upon.

In Sequence 7, the semiconductor recording apparatus 100 records data on the erased block E and the erasable block I shown in the portion (a) of FIG. 12. In this embodiment, selection of a new physical block subjected to data writing is achieved by one-by-one increment in a pointer of the most recently selected physical block. At the end of Sequence 6, new blocks are sequentially selected in order, from a physical block next to the pointer indicative of the physical block bearing the FAT. In accordance with the aforestated algorithm, writing process proceeds while defining correspondences between a logical block for data recording and a free physical block until half-capacity recording is completed. The areas recorded at this time are also represented by "W1". In this way, the flash memory 120 is brought into a state as shown in the portion (b) of FIG. 12.

In Sequence 8, the recorded internal contents are uploaded to the server. Then, in Sequence 9, a physical block for recording is selected from the erasable blocks I shown in the portion (b) of FIG. 12 for FAT writing. The algorithm for the selection is similar to that adopted in Sequence 5. Hence, the FAT is sequentially recorded in order, from a block next to the block recorded last in Sequence 7. The physical block of the newly recorded area will be termed "W2" to make a distinction from the previously recorded area. The physical block bearing the previous FAT becomes an erasable block I. In the portion (c) of FIG. 12, there is shown the state as seen after FAT recording.

In Sequence 10, the logical formatting detecting portion 113 of the command analyzing section 112 detects that FAT has been recorded once again with respect to the logical block 0, and provides output of a detection signal to the logical-to-physical conversion table initializing section 117. In response to this, the logical-to-physical conversion table initializing section 117 initializes the logical-to-physical conversion table 115. The initialized logical-to-physical conversion table is written to the flash memory 120 via the flash control section 118. The physical block W1 in a written state under a condition as shown in the portion (c) of FIG. 12 becomes an erasable physical block I. This condition is shown in the portion (d) of FIG. 12.

Figure 13:
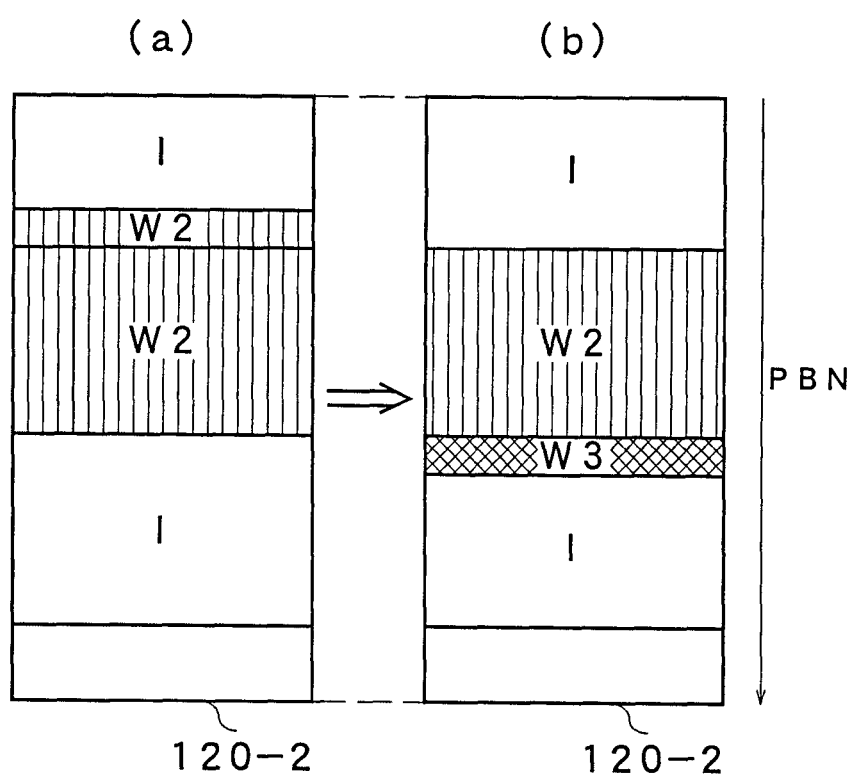
FIG. 13 is a view of the embodiment, showing another condition of the flash memory where those that range from the first to the halves of all logical blocks are recorded upon.

In Sequence 11, data is recorded on the erasable block I shown in the portion (d) of FIG. 12. Also in this case, at the end of Sequence 10, the semiconductor recording apparatus 100 selects new blocks sequentially in order, from a physical block next to the pointer indicative of the physical block bearing the FAT, and performs writing while defining correspondences between a logical block for data recording and a free physical block until half-capacity recording is completed. In this way, the flash memory 120 is brought into a state as shown in the portion (a) of FIG. 13.

In Sequence 12, the recorded internal contents are uploaded to the server. Then, in Sequence 9, physical blocks for recording are sequentially selected from the erasable blocks I shown in the portion (a) of FIG. 13 for FAT writing. Hence, the FAT is sequentially recorded in order, from a block next to the block recorded last in Sequence 11. The physical block of the newly recorded area will be termed "W3" to make a distinction from the previously recorded area. The block bearing the previous FAT becomes an erasable block I. In the portion (b) of FIG. 13, there is shown the state as seen after FAT recording. The logical blocks are sequentially assigned for recording in order, from a block next to the block recorded last in Sequence 9. In this way, the processes in Sequences 9 to 12 will be repeated.

Thus, full-capacity recording is carried out first, whereafter the task involving logical formatting, namely initialization of FAT part, and half-capacity recording is repeated. In this case, even if only half of all the logical addresses to be issued by the file system are produced, all of the physical blocks in the first area of the semiconductor recording apparatus can be written to uniformly.

It is noted that, although the above description deals with the case where, in effecting the assignment of physical blocks to logical blocks, erasable blocks are sequentially selected in order, from the pointer of the most recently recorded block, it is needless to say that, even if recording is performed on erasable blocks and erased blocks in a random fashion, similar effects can be attained.

Moreover, in the high-capacity semiconductor recording apparatus, when there is a large amount of data in the logical-to-physical conversion table, considerable time is required for logical-to-physical conversion table initialization. In view of this, the logical-to-physical conversion table may be divided into K pieces of area portions (K represents a natural number of greater than or equal to 2). In this case, it is advisable that, at the time of logical formatting, the logical-to-physical conversion table initializing section initializes at least one logical-to-physical conversion table area portion, and part of physical blocks are set to be an invalid block. This helps reduce the length of time taken to complete the logical-to-physical conversion table initialization.

It is needless to say that, at this time, the selection of a logical-to-physical conversion table area portion to be initialized from among K pieces of the logical-to-physical conversion table area portions may be made either in orderly sequence or in a random fashion, because intended effects can be attained in either case.

It is noted that, in the abovementioned embodiment, the command analyzing section 112 has the logical formatting detecting portion 113 for receiving a logical formatting command and detecting the accomplishment of logical formatting. Alternatively, the design of the system may be such that the host device issues a logical-to-physical conversion table initialization command after sending out a logical formatting command or prior to the sending of the command. For example, where the host device effects logical formatting, a logical-to-physical conversion table initialization command is issued from the host device immediately before or immediately after FAT table initialization, so that logical-to-physical conversion table initialization can be carried out. In this case, although the host device needs to be provided with the function of issuing logical-to-physical conversion table initialization commands, there is no need to dispose the logical formatting detecting portion within the command analyzing section.

As described heretofore, according to the semiconductor recording apparatus and the semiconductor recording apparatus system of the present embodiment, it is possible to overcome the following problem associated with the conventional art: when a task involving logical formatting and recording up to a certain extent within capacity is repeated after full-capacity recording, updating is performed on only part of physical blocks, with consequent concentration of rewrites on part of physical blocks.

Moreover, rewrite-number errors that arise in the case of determining the number of rewrites in the conventional semiconductor apparatus disclosed in Patent Document 2 can be significantly reduced. Further, the same effects as achieved in physical formatting to erase all blocks can be achieved, and thus the problem of time-consuming execution of physical formatting can be overcome.

It is noted that, while the description of the embodiment refers to a flash memory as a semiconductor memory, the present invention is applicable to various semiconductor memory devices having rewrite-number limitations.

INDUSTRIAL APPLICABILITY

The semiconductor recording apparatus and the semiconductor recording apparatus system pursuant to the present invention are characterized in that nonvolatile memory blocks can be made substantially uniform in terms of the number of rewrites under control, and are therefore suitable for use especially in the field of video recording in which multi-level flash memory of small number of rewrites is used and a huge amount of data are frequently recorded.

The invention claimed is:

1. A semiconductor recording apparatus including a semiconductor memory composed of a plurality of physical blocks, for recording data written by a host device on said semiconductor memory and reading recorded data, comprising:
a block management section which records a logical-to-physical conversion table showing correspondence between a plurality of physical addresses of said semiconductor memory and a plurality of logical addresses on said semiconductor memory, selects a physical block corresponding to a logical block in a command issued from said host device with reference to said logical-to-physical conversion table, and updates said logical-to-physical conversion table upon data writing for implementation of address management;
a logical formatting detecting section for detecting accomplishment of logical formatting for the semiconductor memory; and
a logical-to-physical conversion table initializing section for updating a plurality of physical addresses corresponding to a plurality of logical addresses of the logical-to-physical conversion table, respectively, into invalid addresses based on a detection of logical formatting by said logical formatting detecting section.

2. The semiconductor recording apparatus according to claim 1,
wherein said block management section records said logical-to-physical conversion table sequentially on pages of a predetermined physical block of said semiconductor memory in numerical order according to page number for implementation of updating,
and wherein said logical-to-physical conversion table initializing section updates physical addresses corresponding to at least part of logical addresses into invalid addresses immediately after the detection of completion of logical formatting by said logical formatting detecting section, and records the updated logical-to-physical conversion table sequentially on the pages of the physical block.

3. The semiconductor recording apparatus according to claim 1,
wherein said logical-to-physical conversion table is divided into K pieces of area portions (K represents a natural number of greater than or equal to 2), and, when logical formatting is executed, said logical-to-physical conversion table initializing section selects and initializes at least one of said K pieces of logical-to-physical conversion table area portions.

4. The semiconductor recording apparatus according to claim 2,
wherein said logical-to-physical conversion table is divided into K pieces of area portions (K represents a natural number of greater than or equal to 2), and, when logical formatting is executed, said logical-to-physical conversion table initializing section selects and initializes at least one of the K pieces of logical-to-physical conversion table area portions.

5. A semiconductor recording system comprising:
a host device; and
a semiconductor recording apparatus connected to said host device,
wherein said semiconductor recording apparatus includes:
a semiconductor memory composed of a plurality of physical blocks; and
a block management section which records a logical-to-physical conversion table showing correspondence between a plurality of physical addresses of said semiconductor memory and a plurality of logical addresses on said semiconductor memory, selects a physical block corresponding to a logical block in a command issued from said host device with reference to said logical-to-physical conversion table, and updates said logical-to-physical conversion table upon data writing for implementation of address management,
and wherein said semiconductor recording apparatus records data written by said host device and reads recorded data,
and wherein the host device issues a logical-to-physical conversion table initialization command to said semiconductor recording apparatus in performing logical-formatting of the semiconductor recording apparatus,
and wherein said semiconductor recording apparatus further includes a logical-to-physical conversion table initializing section for updating a plurality of physical addresses corresponding to a plurality of logical addresses of said logical-to-physical conversion table into invalid addresses based on the performance of the logical-formatting in which the logical-to-physical conversion table initialization command is issued from the host device.

6. The semiconductor recording apparatus according to claim 1, wherein the logical formatting is carried out by recording a new file allocation table transferred from the host device to the semiconductor recording apparatus.

7. The semiconductor recording system according to claim 5, wherein the logical formatting is carried out by recording a new file allocation table transferred from the host device to the semiconductor recording apparatus.

* * * * *